(12) United States Patent
Kato et al.

(10) Patent No.: US 6,580,285 B2
(45) Date of Patent: Jun. 17, 2003

(54) OUTPUT BUFFER CIRCUIT WITH SWITCHING SPEED CONTROL CIRCUIT

(75) Inventors: Tatsuo Kato, Kawasaki (JP); Tomio Mitsuhashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/946,602

(22) Filed: Sep. 6, 2001

(65) Prior Publication Data

US 2002/0075033 A1 Jun. 20, 2002

(30) Foreign Application Priority Data

Dec. 15, 2000 (JP) ........................ 2000-382699

(51) Int. Cl.[7] ................. H03K 19/01; H03K 19/0175; H03K 5/153
(52) U.S. Cl. ................. 326/17; 326/86; 327/72
(58) Field of Search ................. 326/17, 26–27, 326/86–87, 83, 112, 119, 121–122; 327/58, 62, 72, 74, 77–81, 83, 88–89, 143

(56) References Cited

U.S. PATENT DOCUMENTS 5,334,885 A * 8/1994 Morris ........................ 326/21
5,821,783 A * 10/1998 Torimaru et al. ............. 326/87
5,864,506 A * 1/1999 Arcoleo et al. ............... 326/83
6,147,521 A * 11/2000 Degoirat et al. ............ 549/206

FOREIGN PATENT DOCUMENTS

JP          04321320 A  * 11/1992  ....... H03K/19/0175

* cited by examiner

*Primary Examiner*—Michael Tokar
*Assistant Examiner*—James H Cho
(74) *Attorney, Agent, or Firm*—Arent Fox Kintner Plotkin & Kahn

(57) ABSTRACT

Provided is a semiconductor device including an input/output buffer or an output buffer with a buffer transistor. The device can control the switching speed of the buffer transistor into a proper value even when there is an change in process conditions and/or temperature. The device includes a control circuit for changing the size of the buffer transistor. The control circuit changes the size of the buffer transistor based on the switching speed of the buffer transistor or a detection transistor, which speed changes in accordance with process conditions and/or temperature.

22 Claims, 17 Drawing Sheets

OUTPUT BUFFER CIRCUIT WITH SWITCHING SPEED CONTROL CIRCUIT

CROSS-REFERENCE TO RELATED APPLICATIONS

This application is based upon and claims priority of Japanese Patent Application No. 2000-382699, filed on Dec. 15, 2000, the contents being incorporated herein by reference.

BACKGROUND OF THE INVENTION

1. Field of the Invention

The present invention relates to semiconductor devices, in particular, including output buffers or input/output buffers.

2. Description of the Related Art

FIG. 16 is a circuit diagram of a conventional output buffer. A buffer 110 with a small transistor size and a low driving capability is a buffer for a high power supply voltage and a buffer 120 with a large transistor size and a high driving capability is a buffer for a low power supply voltage. The level of a power supply voltage is detected, and either the buffer 110 or 120 is selected in accordance with the detection result. The buffer 110 includes P-channel MOS (metal oxide semiconductor) transistors 111 and 112 and N-channel MOS transistors 113 and 114. The buffer 120 includes P-channel MOS transistors 121 and 122 and N-channel MOS transistors 123 and 124.

A comparator 102 compares the power supply voltage with a reference voltage generated by a reference voltage generating circuit 101. An inverter 103 logically inverts the output of the comparator 102 and outputs it to the gates of the transistors 112 and 123. An inverter 104 logically inverts the output of the inverter 103 and outputs it to the gates of the transistors 113 and 122. The gates of the transistors 111, 114, 121, and 124 are supplied with an input signal Sin. When the power supply voltage is high, the transistors 112 and 113 are turned on and the transistors 122 and 123 are turned off, so the buffer 110 is selected. Inversely, when the power supply voltage is low, the transistors 122 and 123 are turned on and the transistors 112 and 113 are turned off, so the buffer 120 is selected. The buffer 110 or 120 outputs an output signal Sout. The output signal Sout is a logically inverted signal of the input signal Sin.

The switching speed of a CMOS (complementary metal oxide semiconductor) transistor formed in a semiconductor changes in accordance with process conditions, temperature, and so on, as well as the above-mentioned power supply voltage. Such a change in the switching speed may cause the following problems.

FIG. 4 shows waveforms of the input signal Sin and the output signal Sout when the transistor switching speed is proper. The output signal Sout changes in its waveform with a substantially rectangular shape between the ground potential (0V) and the power supply voltage VDD. When the switching speed is proper, the thus proper output signal Sout is output.

FIG. 17A shows waveforms of the input signal Sin and the output signal Sout when the transistor switching speed is too low. The rising speed and the falling speed of the output signal Sout are low and the signal falls before it reaches the power supply voltage VDD. As a result, in binary logic consisting of a high level and a low level, the operation of the output signal Sout is delayed, which may cause a malfunction.

FIG. 17B shows waveforms of the input signal Sin and the output signal Sout when the transistor switching speed is too high. Excessive overshoot and undershoot occur in the output signal Sout at each rising timing and each falling timing, respectively. As a result, the output signal Sout is forced to exceed the threshold level of the logical value, which may cause a malfunction. Moreover, such overshoot and undershoot may cause big noise.

In the output buffers shown in FIG. 16, when a switching speed of the transistor has changed due to a change in the power supply voltage, either the buffer 110 or 120 is selected, thereby controlling the transistor switching speed to a proper value. However, no countermeasure can be taken against a change in the transistor switching speed due to a change in process conditions or temperature. As a result, the above-mentioned problem shown in FIG. 17A or 17B arises.

SUMMARY OF THE INVENTION

An object of the present invention is to provide semiconductor devices including input/output buffers or output buffers, which are capable of controlling the transistor switching speed to a proper value even when there is a change in, e.g., process conditions and/or temperature, and to provide control methods thereof.

Another object of the present invention is to provide semiconductor devices capable of detecting the transistor switching speed.

A semiconductor device according to the present invention comprises an output buffer or an input/output buffer including a buffer transistor and a control circuit for changing the size of the buffer transistor. The control circuit changes the size of the buffer transistor on the basis of the switching speed of the buffer transistor or a detection transistor, which speed changes in accordance with process conditions and/or temperature.

The switching speed of the buffer transistor or the detection transistor which changes in accordance with process conditions and/or temperature is detected in advance or in real time, and the size of the buffer transistor is changed in accordance with the detected switching speed. Even when there is a change in process conditions and/or temperature, the switching speed of the buffer transistor can be controlled to a proper value by changing the size of the buffer transistor accordingly.

DETAILED DESCRIPTION OF THE PREFERRED EMBODIMENTS

First Embodiment

Figure 1:
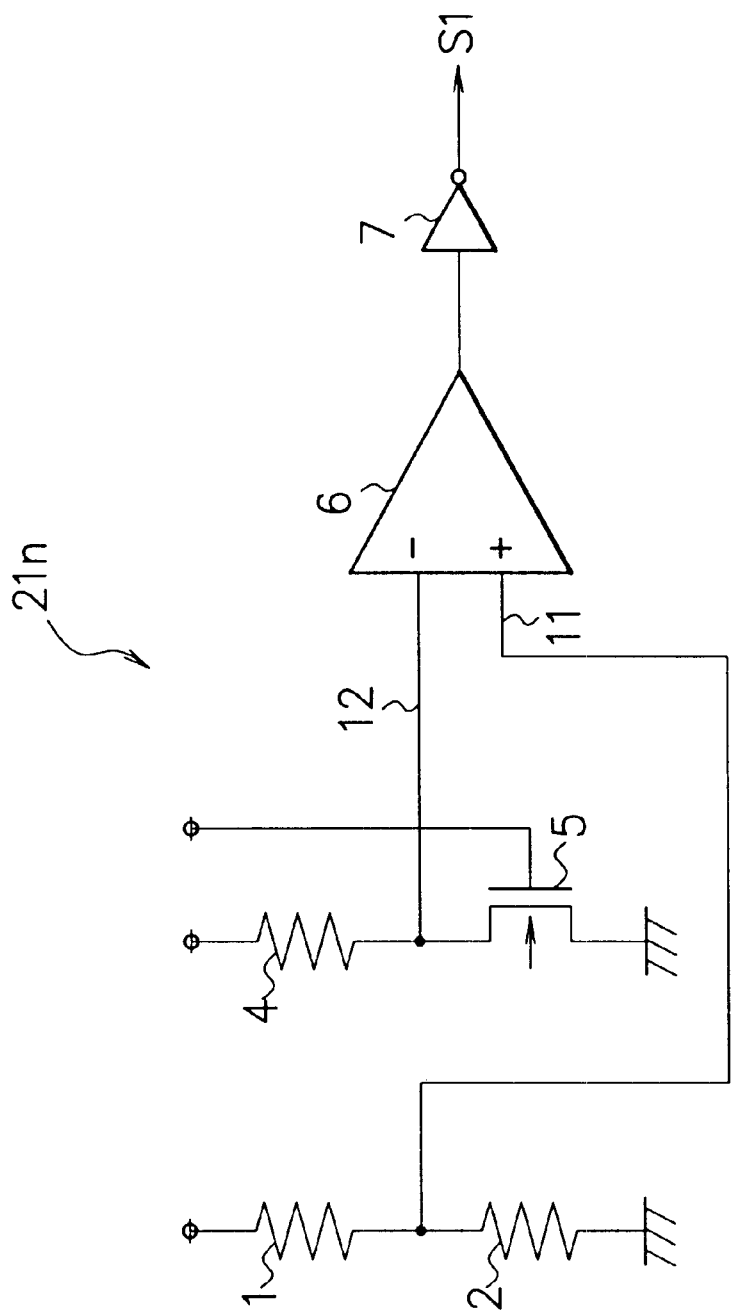
FIG. 1 is a circuit diagram showing an example of construction of a switching speed detecting circuit according to the first embodiment of the present invention.

FIG. 1 is a circuit diagram showing an example of construction of a transistor switching speed detecting circuit 21n according to the first embodiment of the present invention.

The construction of the switching speed detecting circuit 21n will be described first. Resistances 1 and 2 are connected in series between the power supply potential and the ground potential. One end of a resistance 4 is connected to the power supply potential and the other end is connected to the drain of an N-channel MOS transistor 5. In the transistor 5, its gate is connected to the power supply potential and its source is connected to the ground potential to maintain its ON state. In a comparator 6, its positive (+) terminal is connected to the interconnection node between the resistances 1 and 2, its negative (−) terminal is connected to the interconnection node between the resistance 4 and the transistor 5, and its output terminal is connected to the input terminal of an inverter 7. The inverter 7 as a logical NOT circuit logically inverts the output of the comparator 6 and outputs it as a signal S1.

Figure 2:
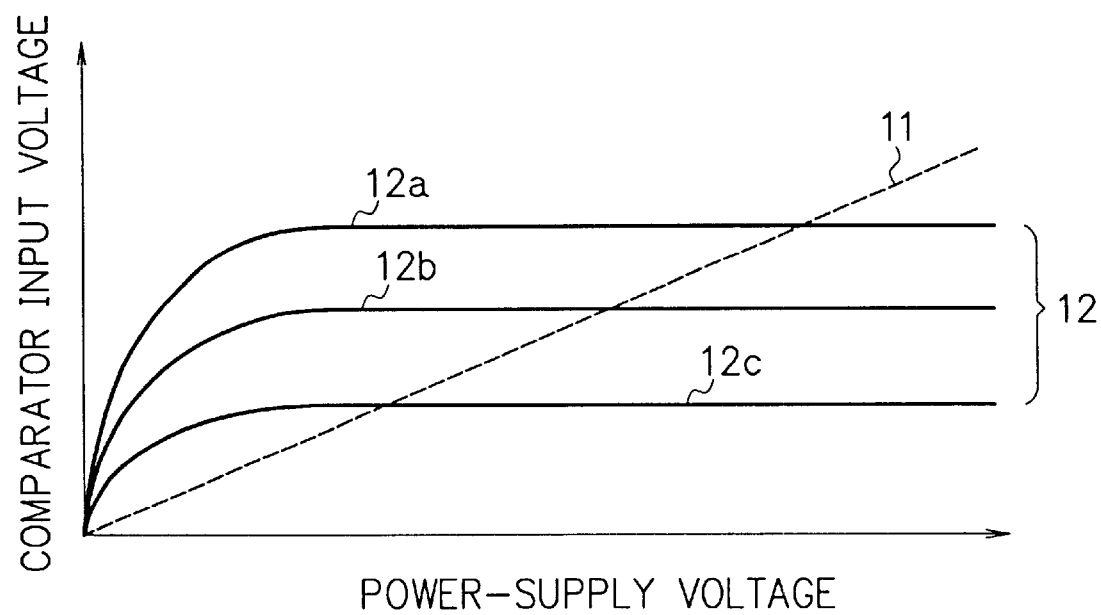
FIG. 2 is a graph for explaining the operation of the switching speed detecting circuit according to the first embodiment.

The operation of the switching speed detecting circuit 21n will be described with reference to the graph of FIG. 2. In the graph of FIG. 2, the axis of abscissas represents power supply voltage and the axis of ordinates represents input voltage in relation to the (+) terminal and the (−) terminal of the comparator 6. In the comparator 6, a reference voltage 11 divided by the resistances 1 and 2 is input to the (+) terminal while a voltage 12 between the source and drain of the transistor 5 is input to the (−) terminal.

The reference voltage 11 is proportional to the power supply voltage. The voltage 12 has a fixed value in the saturation region in which the power supply voltage is at or higher than a predetermined value. In the saturation region, the fixed value can take one of the values of, e.g., voltages 12a, 12b, and 12c in accordance with the level of the drain current flowing in the transistor 5. The voltages 12a, 12b, and 12c appear at low, medium, and high drain currents, respectively. The voltage 12a indicates a low switching speed of the transistor 5 because of a small drain current, a high ON resistance of the transistor 5, and so a high CR time constant. Contrastingly, the voltage 12c indicates a high switching speed of the transistor 5 because of a large drain current, a low ON resistance of the transistor 5, and so a low CR time constant. Thus, the higher the voltage 12 is, the lower the switching speed is. In other words, the lower the voltage 12 is, the higher the switching speed is. The switching speed is substantially proportional to the drain current.

In a predetermined power supply voltage, the comparator 6 compares the voltage 11 at the (+) terminal with the voltage 12 at the (−) terminal. It outputs a high level when the voltage 11 at the (+) terminal is higher than the voltage 12 at the (−) terminal, and outputs a low level in the reverse case. In other words, the comparator 6 outputs the low level when the drain current is small and the switching speed of the transistor 5 is low, and outputs the high level when the drain current is large and the switching speed of the transistor 5 is high.

The inverter 7 logically inverts the output of the comparator 6 and outputs it as the signal S1. Therefore, the signal S1 thus output is at a high level when the drain current is small and the switching speed of the transistor 5 is low, and at a low level when the drain current is large and the switching speed of the transistor 5 is high.

Figure 3:
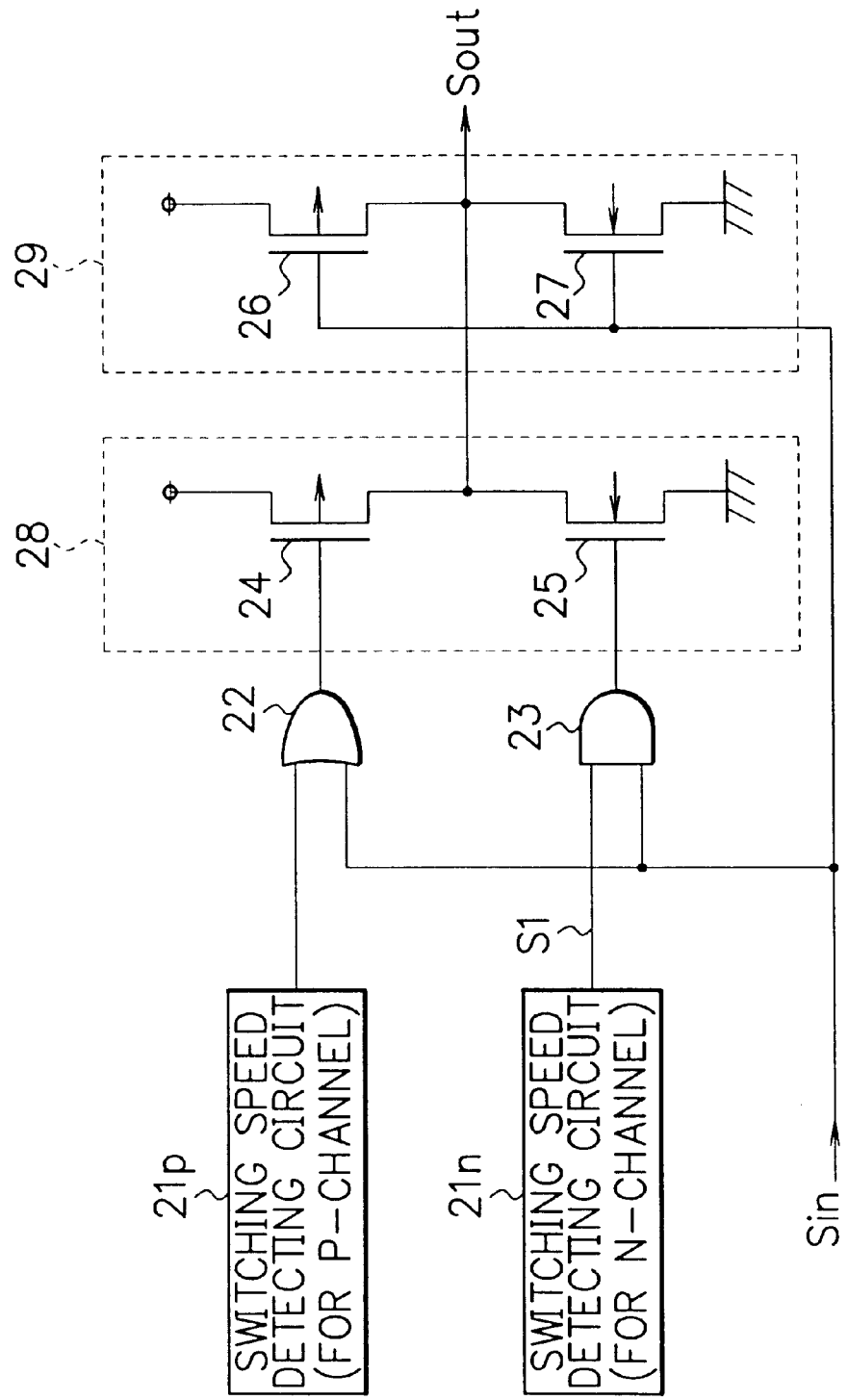
FIG. 3 is a circuit diagram showing an example of construction of a semiconductor device including switching speed detecting circuits and output buffers according to the first embodiment.

FIG. 3 is a circuit diagram showing an example of construction of a semiconductor device including switching speed detecting circuits and output buffers according to the first embodiment. The switching speed detecting circuit 21n for N-channel is the same as the switching speed detecting circuit 21n shown in FIG. 1. A switching speed detecting circuit 21p for P-channel is a circuit for detecting the switching speed of a P-channel MOS transistor, wherein the P-channel MOS transistor is used instead of the N-channel MOS transistor 5 in the switching speed detecting circuit 21n in FIG. 1 and the ground potential is connected to the gate of the P-channel MOS transistor.

The switching speed detecting circuit 21n for N-channel outputs a high level when the switching speed is low, and outputs a low level when the switching speed is high. The switching speed detecting circuit 21p for P-channel outputs a high level when the switching speed is high, and outputs a low level when the switching speed is low.

In an OR circuit 22, one input is connected to the output of the switching speed detecting circuit 21p for P-channel and the other input is connected to the line for the input signal Sin. In an AND circuit 23, one input is connected to the output of the switching speed detecting circuit 21n for N-channel and the other input is connected to the line for the input signal Sin.

A first buffer 28 includes a CMOS transistor consisting of a P-channel MOS transistor 24 and an N-channel MOS transistor 25. A second buffer 29 includes a CMOS transistor consisting of a P-channel MOS transistor 26 and an N-channel MOS transistor 27.

The construction of the first buffer 28 will be described first. In the P-channel MOS transistor 24, its gate is connected to the output of the OR circuit 22, its source is connected to the power supply potential, and its drain is connected to the drain of the transistor 25. In the N-channel MOS transistor 25, its gate is connected to the output of the AND circuit 23, and its source is connected to the ground potential. The interconnection node between the drain of the transistor 24 and the drain of the transistor 25 is connected to the line for an output signal Sout.

The construction of the second buffer 29 will be described next. In the P-channel MOS transistor 26, its gate is connected to the line for the input signal Sin, its source is connected to the power supply potential, and its drain is connected to the drain of the transistor 27. In the N-channel MOS transistor 27, its gate is connected to the line for the input signal Sin, and its source to the ground potential. The interconnection node between the drain of the transistor 26 and the drain of the transistor 27 is connected to the line for the output signal Sout.

An operation of the semiconductor device will be described. The switching speed detecting circuit 21p for P-channel outputs a high level when the switching speed of the P-channel MOS transistor is high, and outputs a low level when the switching speed of the P-channel MOS transistor is low. The switching speed detecting circuit 21n for N-channel outputs a low level when the switching speed of the N-channel MOS transistor is high, and outputs a high level when the switching speed of the N-channel MOS transistor is low.

First, a case wherein the transistor switching speed is relatively high (proper) will be described. The switching speed detecting circuit 21p for P-channel outputs a high level and the switching speed detecting circuit 21n for N-channel outputs a low level. Since the OR circuit 22 receives the high level from the switching speed detecting circuit 21p for P-channel, it always outputs a high level irrespective of the level of the input signal Sin. Since the gate of the transistor 24 is always supplied with the high level, the transistor 24 is turned off to disconnect the line for the output signal Sout from the power supply potential. Since the AND circuit 23 receives the low level from the switching speed detecting circuit 21n for N-channel, it always outputs a low level irrespective of the level of the input signal Sin. Since the gate of the transistor 25 is always supplied with the low level, the transistor 25 is turned off to disconnect the line for the output signal Sout from the ground potential.

Figure 4:
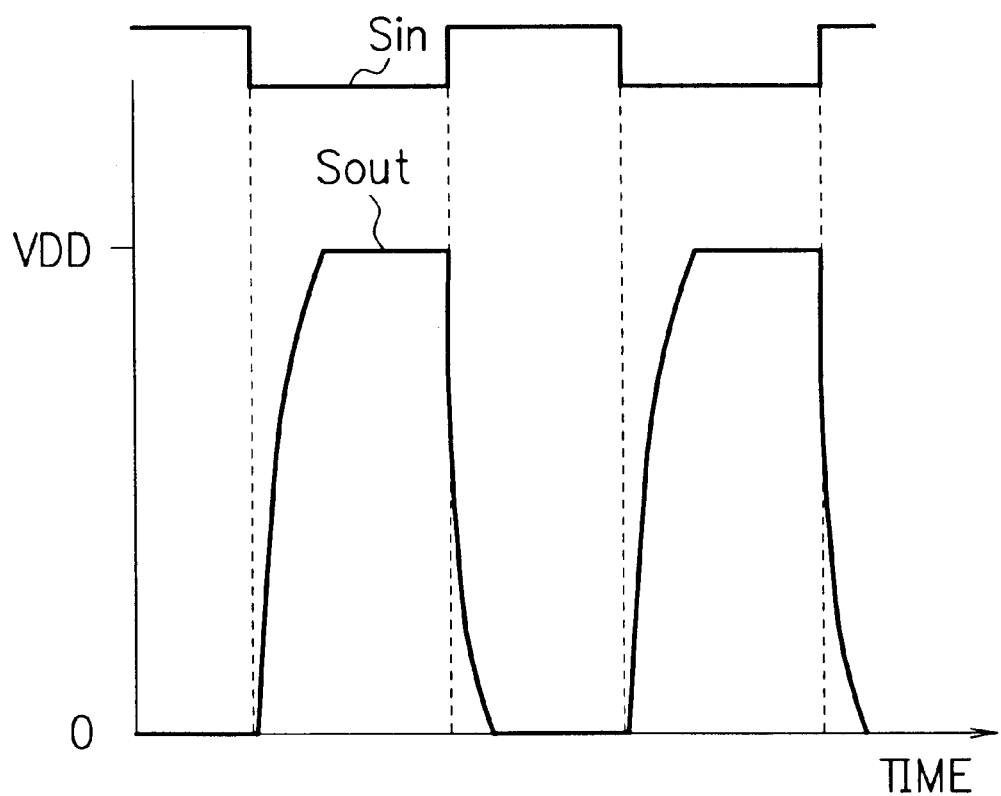
FIG. 4 is a waveform chart of input/output signals of the semiconductor device according to the first embodiment.

As a result, the first buffer 28 does not operate and only the second buffer 29 operates. When the input signal Sin is at a high level, the transistor 26 is turned off and the transistor 27 is turned on. Thus, the line for the output signal Sout is connected to the ground potential so that the output signal Sout may be at a low level. Contrastingly, when the input signal Sin is at a low level, the transistor 26 is turned on and the transistor 27 is turned off. Thus, the line for the output signal Sout is connected to the power supply potential so that the output signal Sout may be at a high level. As shown in FIG. 4, the output signal Sout is output as a logically inverted signal of the input signal Sin. At this time, the switching speed of the buffer transistors is at a proper value.

A case wherein the transistor switching speed is low will be described next. The switching speed detecting circuit 21p for P-channel outputs a low level and the switching speed detecting circuit 21n for N-channel outputs a high level. Since the OR circuit 22 receives the low level from the switching speed detecting circuit 21p for P-channel, it outputs the same signal as the input signal Sin. Since the AND circuit 23 receives the high level from the switching speed detecting circuit 21n for N-channel, it outputs the same signal as the input signal Sin. Since the P-channel MOS transistors 24 and 26 are both supplied with the input signal Sin in their gates, they perform the same operation. Since the N-channel MOS transistors 25 and 27 are both supplied with the input signal Sin in their gates, they perform the same operation.

Consequently, the first buffer 28 and the second buffer 29 are connected in parallel with each other and operate in this state. More specifically, when the input signal Sin is at a high level, the transistors 24 and 26 are turned off, and the transistors 25 and 27 are turned on and connected in parallel. The transistors 25 and 27 operate in this state. The line for the output signal Sout is connected to the ground potential to be at a low level. This is equivalent to the case wherein the gate widths of the transistors are broadened, thereby increasing the drive capabilities of the buffers. Contrastingly, when the input signal Sin is at a low level, the transistors 25 and 27 are turned off, and the transistors 24 and 26 are turned on and connected in parallel. The transistors 24 and 26 operate in this state. The line for the output signal Sout is connected to the power-source potential to be at a high level. This is equivalent to the case wherein the gate widths of the transistors are broadened, thereby increasing the drive capabilities of the buffers. As shown in FIG. 4, the output signal Sout is output as a logically inverted signal of the input signal Sin. At this time, since the first buffer 28 and the second buffer 29 are both in operation, the switching speed of the transistors is at a proper value.

As described above, when the switching speed of the transistors is relatively high, only the second buffer 29 is put into operation, and when the switching speed of the transistors is low, the first buffer 28 and the second buffer 29 are both put into operation. Thus, the switching speed of the buffer transistors can always be kept at a proper value.

Figure 17A:
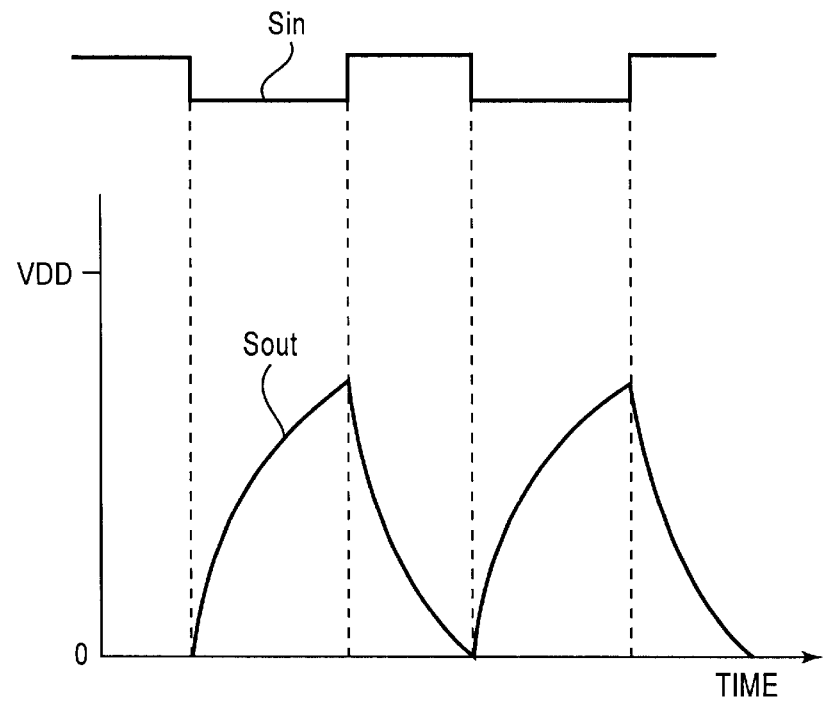
FIG. 17A and FIG. 17B are waveform charts of input/output signals in case of too low and too high switching speeds, respectively.
Figure 17B:
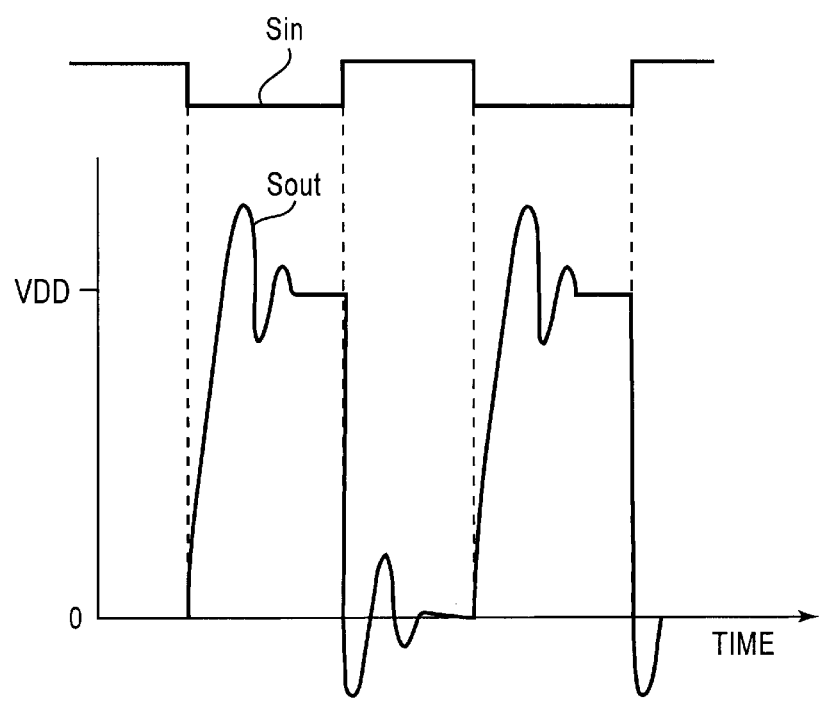

When the switching speed is too low, the rising speed and the falling speed of the output signal Sout become low to cause a malfunction as shown in FIG. 17A. On the other hand, when the switching speed is too high, excessive overshoot and undershoot occur in the output signal Sout at each rising timing and each falling timing to cause a malfunction and big noise.

The switching speed may change in accordance with a change in process conditions, temperature, and so on, as well as a change in the power supply voltage. In the semiconductor device according to this embodiment, even when there is a change in the power supply voltage, process conditions and/or temperature, and so on, the switching speed detecting circuits 21p and 21n detect the switching speed and the size of the buffer transistor is changed in accordance with the detected switching speed. Thus, the switching speed can always be kept at a proper value as shown in FIG. 4.

Second Embodiment

Although the first embodiment exemplified the case wherein the switching speed detecting circuits 21n and 21p detect two states of the switching speed, that is, high and low, the second embodiment of the present invention intends to detect three or more states of the switching speed. In this embodiment, a case wherein three states of the switching speed are detected will be described by way of example.

Figure 5:
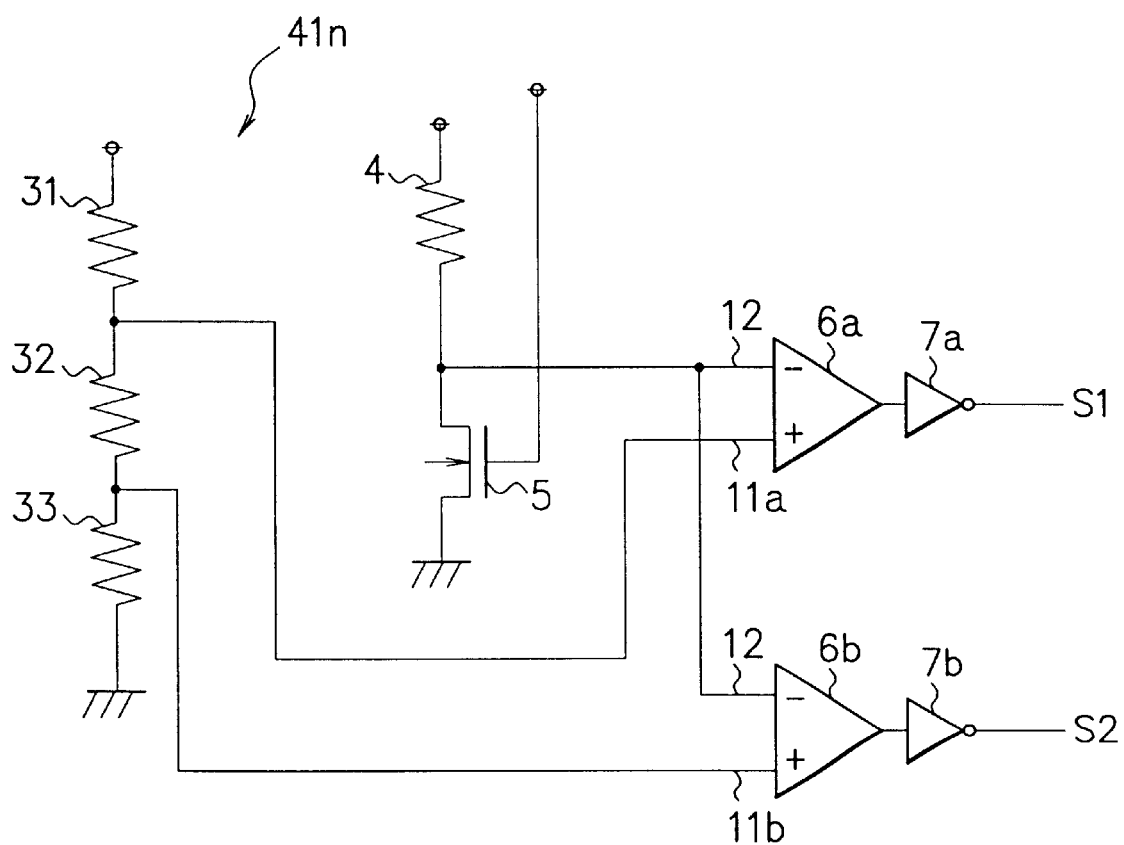
FIG. 5 is a circuit diagram showing an example of construction of a switching speed detecting circuit according to the second embodiment of the present invention.

FIG. 5 is a circuit diagram showing an example of construction of a switching speed detecting circuit 41n for N-channel according to the second embodiment of the present invention. Three resistances 31, 32, and 33 are connected in series between the power supply potential and the ground potential. One end of the resistance 4 is connected to the power supply potential and the other end is connected to the drain of the N-channel MOS transistor 5. In the transistor 5, its gate is connected to the power supply potential, and its source is connected to the ground potential. In a first comparator 6a, its positive (+) terminal is connected to the interconnection node between the resistances 31 and 32, and its negative (−) terminal is connected to the interconnection node between the drain of the transistor 5 and the resistance 4. In an inverter 7a, its input is connected to the output of the first comparator 6a, and its output is connected to the line for the signal S1. In a second comparator 6b, its (+) terminal is connected to the interconnection node between the resistances 32 and 33, and its (−) terminal is connected to the interconnection node between the drain of the transistor 5 and the resistance 4. In an inverter 7b, its input is connected to the output of the second comparator 6b, and its output is connected to the line for a signal S2.

Figure 6:
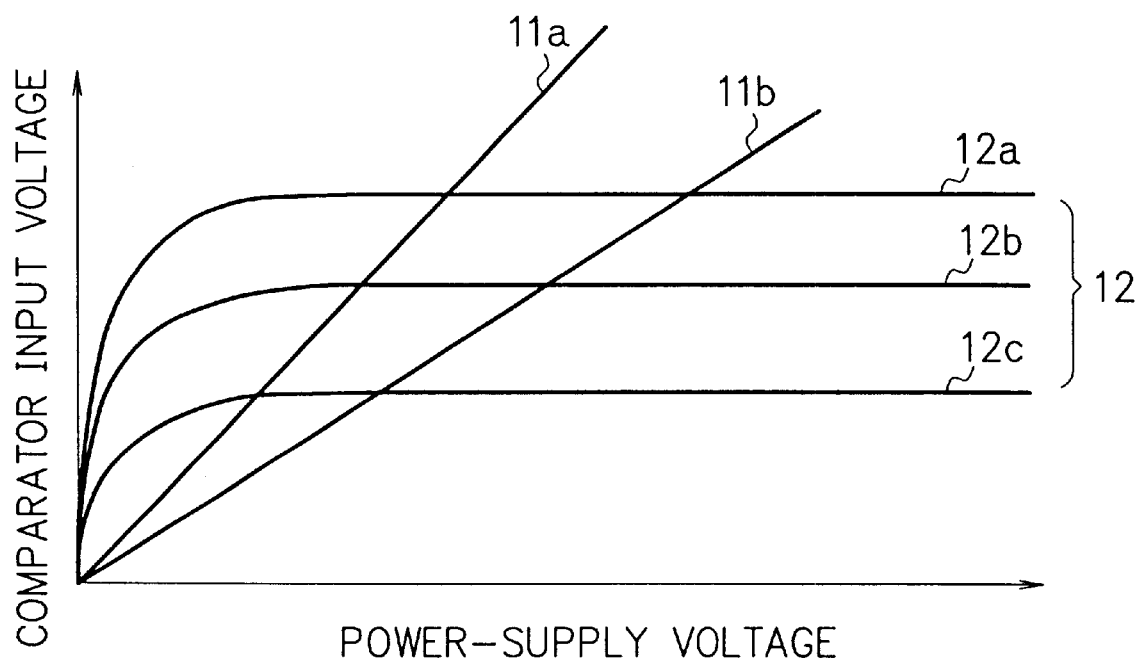
FIG. 6 is a graph for explaining the operation of the switching speed detecting circuit according to the second embodiment.

The first comparator 6a compares a high reference voltage 11a with the voltage 12 between the source and drain of the transistor 5. It outputs a high level when the reference voltage 11a is higher than the voltage 12, and outputs a low level in the reverse case. The second comparator 6b compares a low reference voltage 11b with the voltage 12 between the source and drain of the transistor 5. It outputs a high level when the reference voltage 11b is higher than the voltage 12, and outputs a low level in the reverse case. As shown in FIG. 6, the comparisons of the voltage 12 with the high and low reference voltages 11a and 11b make it possible to detect three states of the switching speed as the signals S1 and S2.

Figure 7:
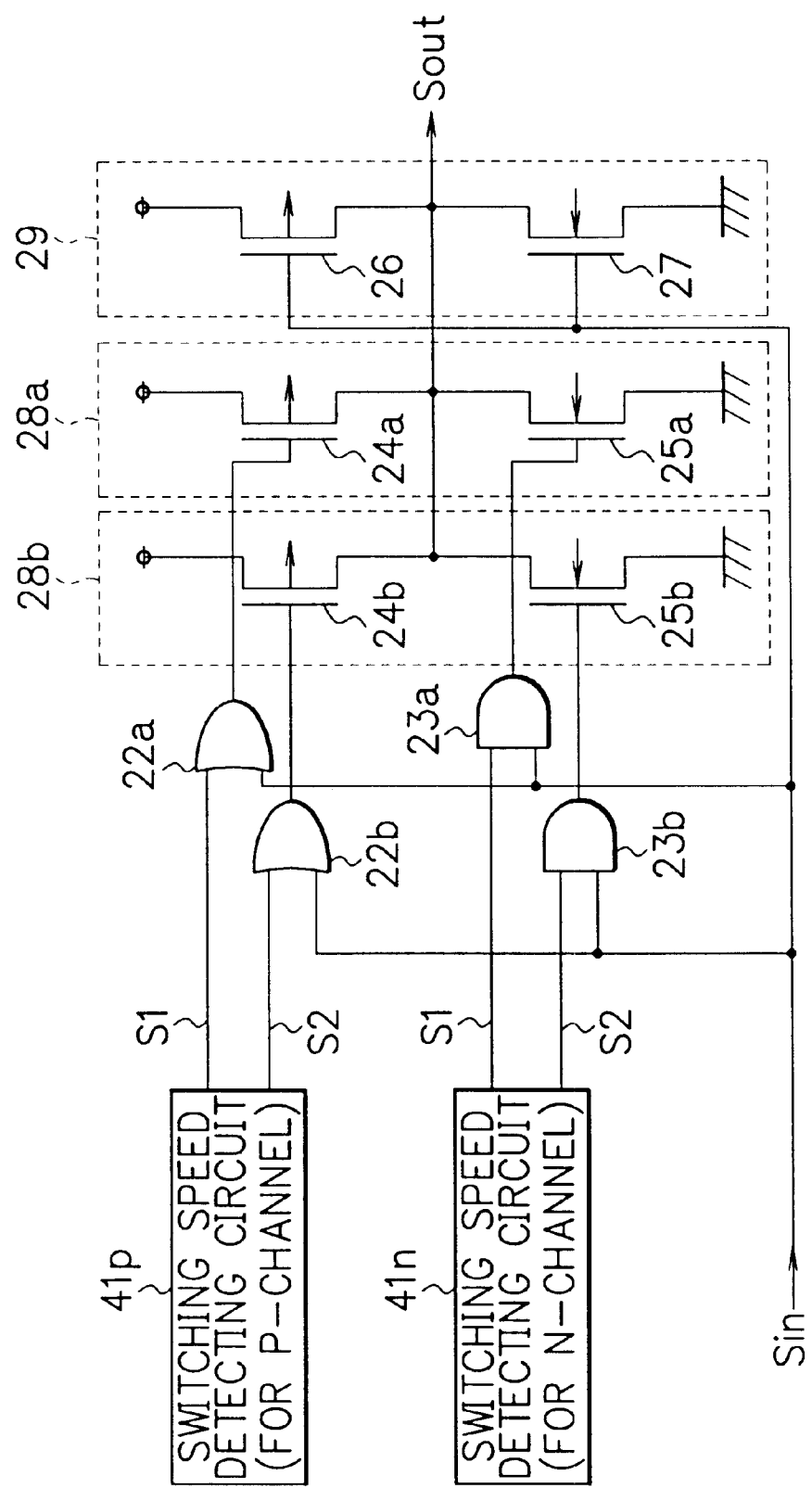
FIG. 7 is a circuit diagram showing an example of construction of a semiconductor device including switching speed detecting circuits and output buffers according to the second embodiment.

FIG. 7 is a circuit diagram showing an example of construction of a semiconductor device including switching speed detecting circuits and output buffers according to the second embodiment. The switching speed detecting circuit 41n for N-channel has the same construction as that shown in FIG. 6. A switching speed detecting circuit 41p for P-channel is a circuit in which a P-channel MOS transistor is used in the switching speed detecting circuit 41n for N-channel shown in FIG. 6, like the first embodiment.

An OR circuit 22a is supplied at its one input with the signal S1 of the switching speed detecting circuit 41p for P-channel, and at its other input with the input signal Sin. An OR circuit 22b is supplied at its one input with the signal S2 of the switching speed detecting circuit 41p for P-channel, and at its other input with the input signal Sin.

An AND circuit 23a is supplied at its one input with the signal S1 of the switching speed detecting circuit 41n for N-channel, and at its other input with the input signal Sin. An AND circuit 23b is supplied at its one input with the signal S2 of the switching speed detecting circuit 41n for N-channel, and at its other input with the input signal Sin.

A first buffer 28a includes a P-channel MOS transistor 24a and an N-channel MOS transistor 25a. The gate of the transistor 24a is connected to the output of the OR circuit 22a. The gate of the transistor 25a is connected to the output of the AND circuit 23a.

A second buffer 28b includes a P-channel MOS transistor 24b and an N-channel MOS transistor 25b. The gate of the transistor 24b is connected to the output of the OR circuit 22b. The gate of the transistor 25b is connected to the output of the AND circuit 23b.

A third buffer 29 includes a P-channel MOS transistor 26 and an N-channel MOS transistor 27. The transistors 26 and 27 are supplied with the input signal Sin at their gates.

The switching speed detecting circuits 41p and 41n can output three states of switching speed detection results, i.e., a high speed, a medium speed, and a low speed. When the switching speed is high, only the third buffer 29 operates. When it is medium, the second buffer 28b and the third buffer 29 operate. When it is low, the first to the third buffers 28a, 28b, and 29 operate.

The lower the detected speed is, the larger the number of buffers, i.e., the number of transistors, connected in parallel is. The drive capacity of the buffers is thereby increased. This makes it possible to always control the switching speed into a proper value even when there is a change in process conditions, temperature, and so on. Although the case wherein three states of the switching speed are detected has been described, four or more states of the switching speed can be detected likewise to control the switching speed of the buffer transistors. As the number of states to be detected is increased, the more accurate control of the switching speed can be performed.

Third Embodiment

Figure 8:
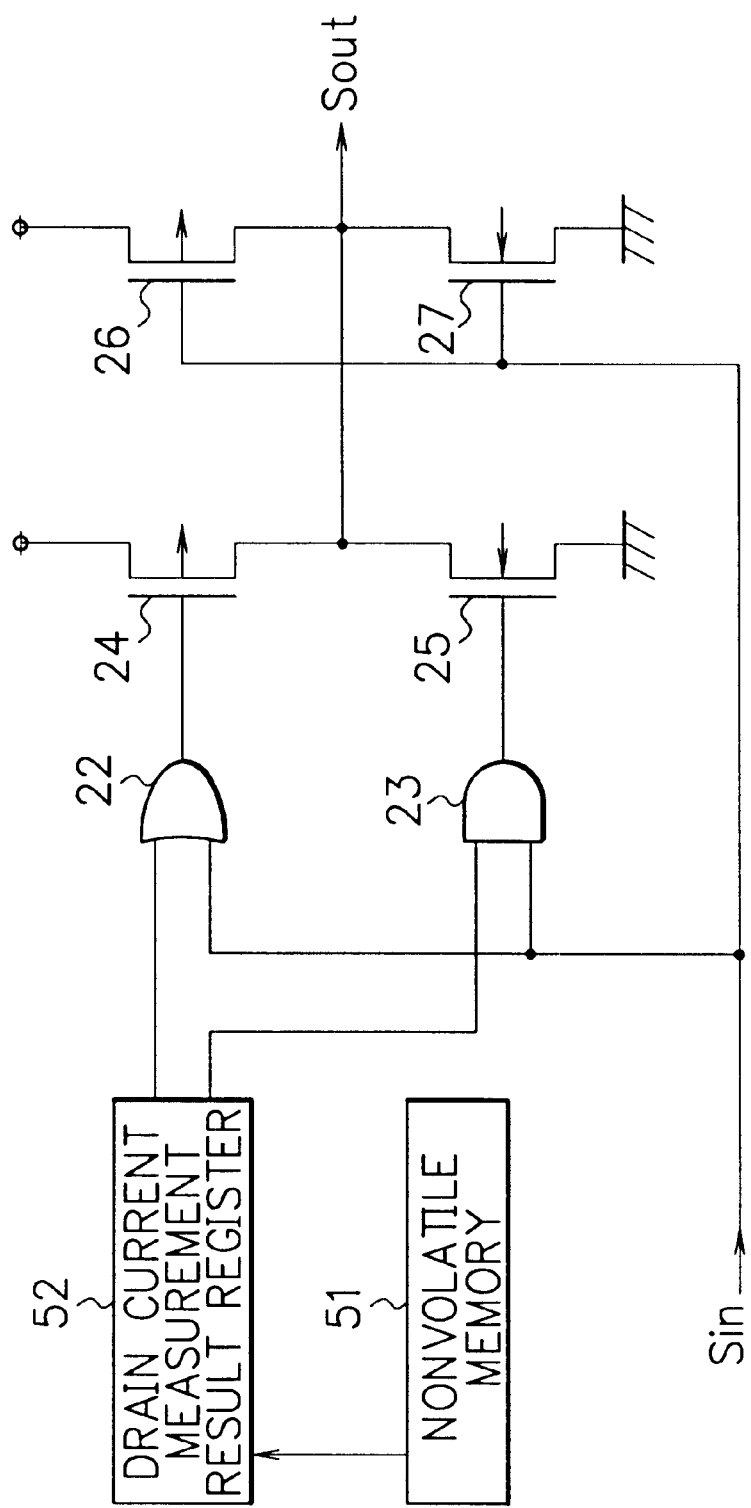
FIG. 8 is a circuit diagram showing an example of construction of a semiconductor device including output buffers according to the third embodiment of the present invention.

FIG. 8 is a circuit diagram showing an example of construction of a semiconductor device including output buffers according to the third embodiment of the present invention. In this third embodiment, a nonvolatile memory 51 and a drain current measurement result register 52 are provided instead of the switching speed detecting circuits 21p and 21n in the first embodiment (FIG. 3), and the other feature is the same as in the first embodiment.

As a preparatory stage, the drain current of an MOS transistor for buffer or detection is measured at the time of a PP test (wafer test) conducted in a wafer state or an FT test (final test) conducted in a package state. The measured drain current indicates the switching speed of the transistor. The switching speed is low when the drain current is small, while the switching speed is high when the drain current is large.

The data of the switching speed is stored in advance in the nonvolatile memory 51. The data can indicate two, three, or more states of the switching speed as described above. A case of two states will be described below by way of example. The nonvolatile memory 51 can keep its storage contents even when the power supply is cut off.

The drain current measurement result register 52 reads out the data of the drain current, i.e., the switching speed, from the nonvolatile memory 51 to make outputs similar to those of the switching speed detecting circuits 21p and 21n in the first embodiment (FIG. 3). More specifically, when the switching speed is low, the drain current measurement result register 52 outputs a low level to the OR circuit 22 and outputs a high level to the AND circuit 23. When the switching speed is high, it outputs a high level to the OR circuit 22 and outputs a low level to the AND circuit 23. The subsequent operation is the same as in the first embodiment (FIG. 3).

According to the third embodiment, since the nonvolatile memory 51 and the drain current measurement result register 52 are used instead of the switching speed detecting circuits 21p and 21n, the size and cost of the semiconductor device can be reduced in comparison with the first embodiment. But, in the third embodiment, since the switching speed is not detected and controlled in real time unlike the first embodiment, it can not cope with a change in temperature but can cope with a change in process conditions. That is, the nonvolatile memory 51 stores the data of the switching speed taking a change in process conditions into consideration, and thereby the switching speed of the buffer transistors is controlled.

Fourth Embodiment

Figure 9:
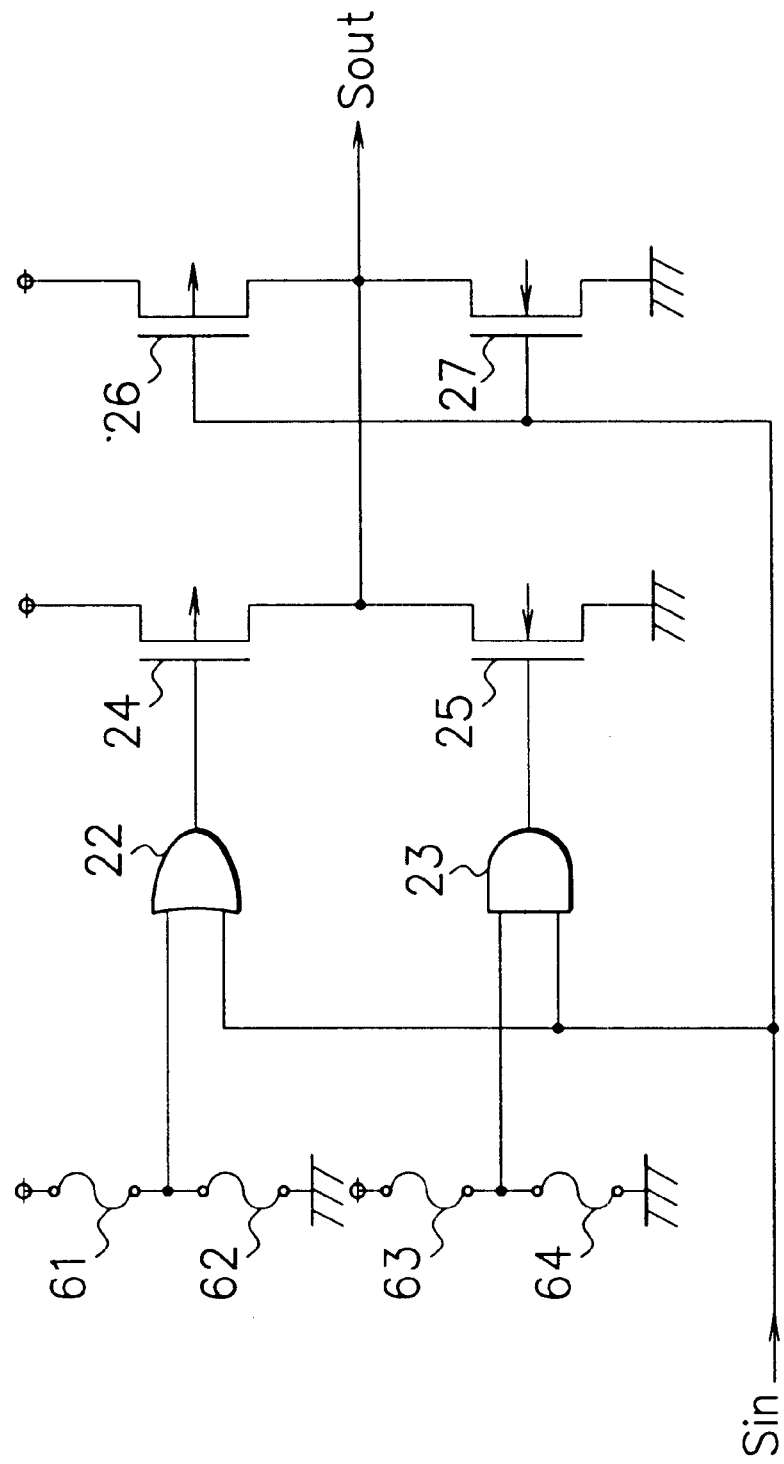
FIG. 9 is a circuit diagram showing an example of construction of a semiconductor device including output buffers according to the fourth embodiment of the present invention.

FIG. 9 is a circuit diagram showing an example of construction of a semiconductor device including output buffers according to the fourth embodiment of the present invention. In this fourth embodiment, fuses 61, 62, 63, and 64 are provided instead of the switching speed detecting circuits 21*p* and 21*n* in the first embodiment (FIG. 3), and the other feature is the same as in the first embodiment.

As a preparatory stage, like the third embodiment, the drain current of an MOS transistor for buffer or detection is measured at the time of a PP test conducted in a wafer state or an FT test conducted in a package state. In accordance with the measured drain current, either the fuse 61 or 62 is cut off and either the fuse 63 or 64 is cut off. When the drain current is low, i.e., when the switching speed is low, the fuses 61 and 64 are cut off while the fuses 62 and 63 are kept intact. Contrastingly, when the drain current is high, i.e., when the switching speed is high, the fuses 62 and 63 are cut off while the fuses 61 and 64 are kept intact. The fuses 61 to 64 can be cut off by, for example, irradiation with a laser. The operation of this semiconductor device is the same as in the first embodiment (FIG. 3) and the third embodiment (FIG. 8).

According to the fourth embodiment, the same effect as in the third embodiment can be obtained, moreover, the size and cost of the semiconductor device can be reduced more than the third embodiment. Although the third embodiment uses the nonvolatile memory and the fourth embodiment uses the fuses, another type of memory may be used also.

Fifth Embodiment

Figure 10:
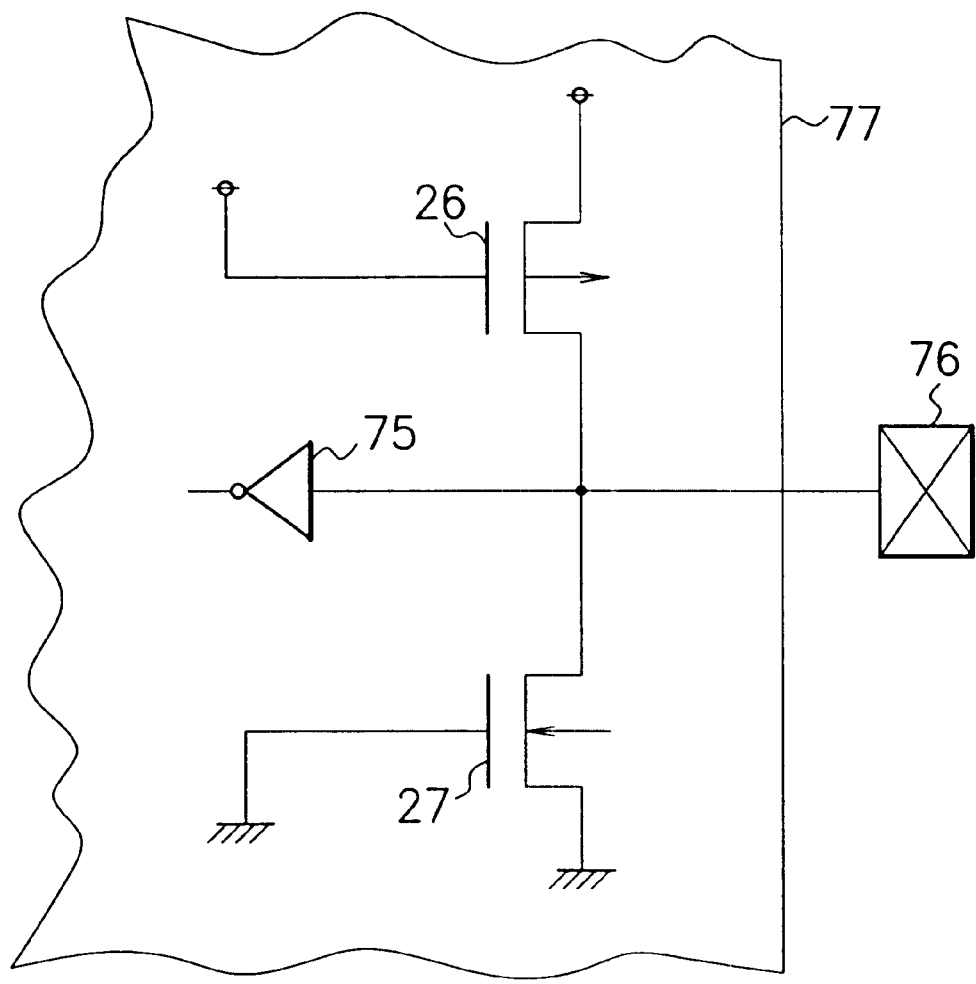
FIG. 10 is a circuit diagram showing an example of construction of a semiconductor device including an input/output buffer according to the fifth embodiment of the present invention.

FIG. 10 is a circuit diagram showing an example of construction of a semiconductor device including an input/output buffer according to the fifth embodiment of the present invention. In the semiconductor device according to this fifth embodiment, an inverter 75 is added to the output buffer of the first to fourth embodiments to constitute an input/output buffer.

This semiconductor device including the input/output buffer is provided in a semiconductor chip 77. The semiconductor chip 77 is connected to a pin 76 of an IC package through the line for an output signal Sout. The input of the inverter 75 is connected to the pin 76.

In an output state, the input/output buffer is in the same connection state as in the first to fourth embodiments, and in an input state, it is controlled into a connection state as shown in FIG. 10. More specifically, in the input state, the gate of the P-channel MOS transistor 26 is at a high level while the gate of the N-channel MOS transistor 27 is at a low level. Thus, the transistors 26 and 27 are turned off. After this, a signal input through the pin 76 is supplied to the inverter 75. Although the above-described first to fourth embodiments use the output buffers, this fifth embodiment allows the first to fourth embodiment to use the input/output buffer.

Sixth Embodiment

Figure 11:
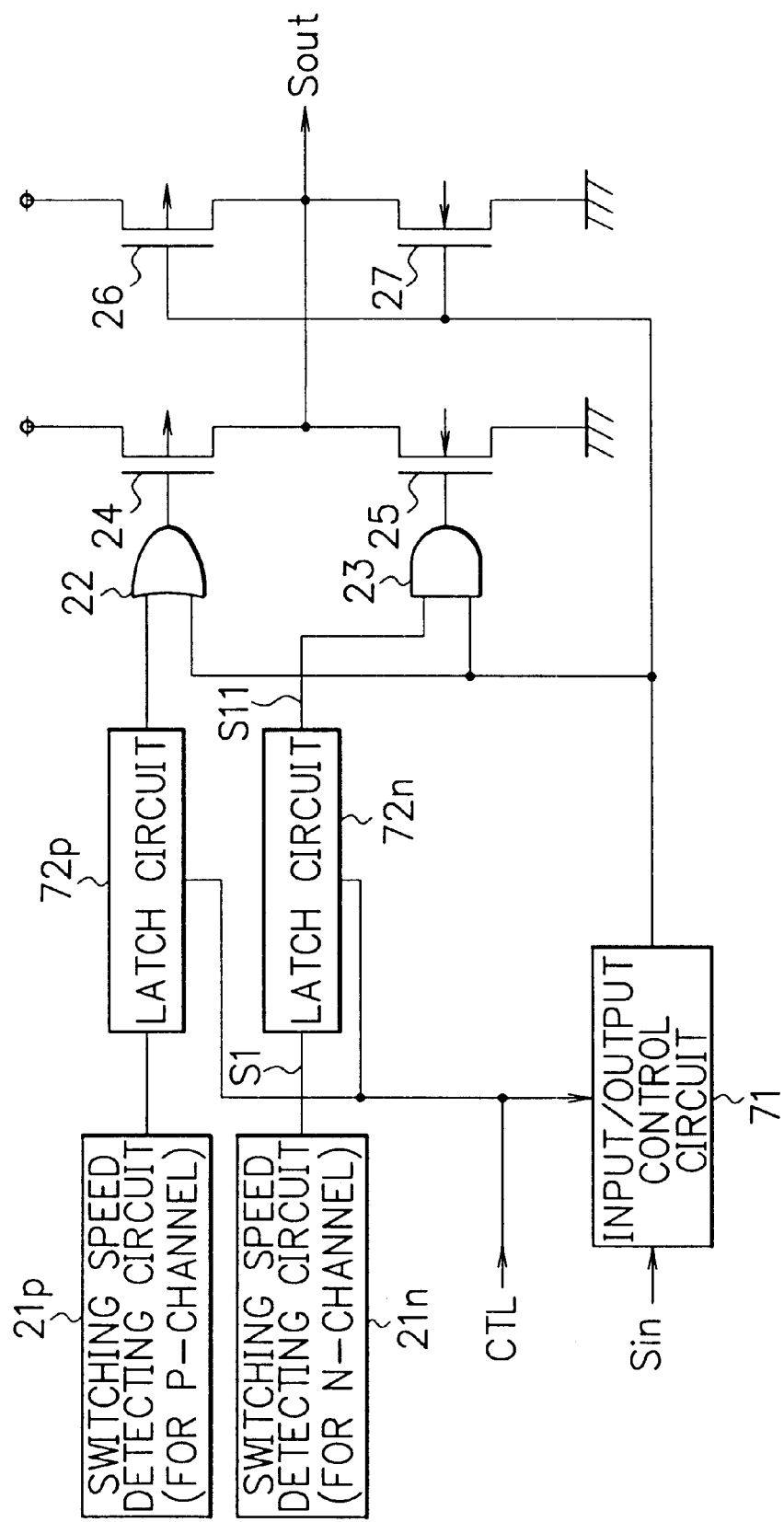
FIG. 11 is a circuit diagram showing an example of construction of a semiconductor device including input/output buffers according to the sixth embodiment of the present invention.

FIG. 11 is a circuit diagram showing an example of construction of a semiconductor device including input/output buffers according to the sixth embodiment of the present invention. FIG. 11 shows an output state of the input/output buffers. In an input state, they are controlled to have the construction shown in FIG. 10. In this sixth embodiment, latch circuits 72*p* and 72*n* and an input/output control circuit 71 are added to the first embodiment (FIG. 3). The other feature is the same as in the first embodiment. According to this embodiment, in order to stabilize an output signal, the size of the buffer, i.e., the size of the buffer transistors is not changed in the output state and the size of the buffer transistors can be changed only in the input state.

An input/output switching signal CTL indicates either the input or output state. When the signal CTL indicates the output state, the input/output control circuit 71 supplies the input signal Sin to the OR circuit 22, the AND circuit 23, and the gates of the transistors 26 and 27. When the signal CTL indicates the input state, the input/output control circuit 71 supplies a signal for turning off the transistors 24, 25, 26, and 27 to the OR circuit 22, the AND circuit 23, and the gates of the transistors 26 and 27.

In the latch circuit 72*p*, its control terminal is connected to the line for the signal CTL, its input terminal is connected to the output of the switching speed detecting circuit 21*p* for P-channel, and its output terminal is connected to the input of the OR circuit 22. In the latch circuit 72*n*, its control terminal is connected to the line for the signal CTL, its input terminal is connected to the output of the switching speed detecting circuit 21*n* for N-channel, and its output terminal is connected to the input of the AND circuit 23.

The operation of the latch circuit 72*n* will be described with reference to the timing chart of FIG. 12. In the control signal CTL, for example, a high level indicates a signal-through state (the input is output as it is), and a low level indicates a state of latching a signal. An input signal S1 is the input signal of the latch circuit 72*n*. An output signal S11 is the output signal of the latch circuit 72*n*.

When the signal CTL is at a low level, the latch circuit 72*n* holds the input signal S1 at that time. When the CTL signal is at a high level, the output signal S11 is the same as the input signal S1. Only in the input state wherein the CTL signal is at the high level, the output signal S11 can be changed, and so the buffer transistor size can be changed. The operation of the latch circuit 72*p* is the same as that of the latch circuit 72*n*. When the input/output buffers are in the output state, since the buffer transistor size does not change, the stable output signal Sout can be output.

Seventh Embodiment

Figure 13:
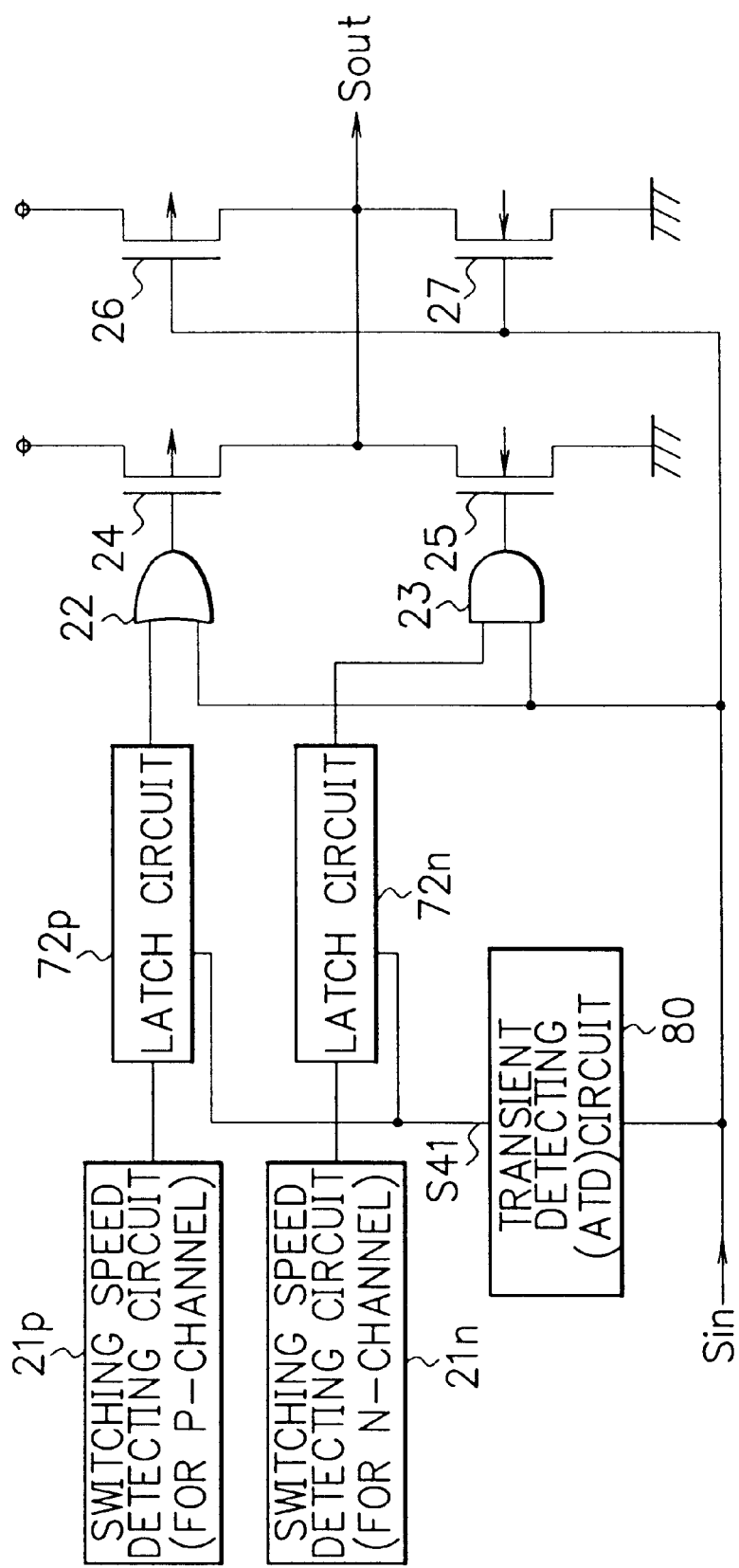
FIG. 13 is a circuit diagram showing an example of construction of a semiconductor device including output buffers or input/output buffers according to the seventh embodiment of the present invention.

FIG. 13 is a circuit diagram showing an example of construction of a semiconductor device including output buffers according to the seventh embodiment of the present invention. Input/output buffers may be used instead of the output buffers. In this seventh embodiment, the latch circuits 72*p*, 72*n* and a transient detecting circuit 80 are added to the first embodiment (FIG. 3). The other feature is the same as in the first embodiment. In this embodiment, in order to stabilize an output signal, the buffer size, i.e., the buffer transistor size is not changed while the input signal Sin is changing.

The transient detecting circuit 80, which is equivalent to an ATD (address transition detector) circuit, inputs an input signal Sin and outputs an output signal S41. The output signal S41 is at a low level only when the input signal Sin is changing.

In the latch circuit 72*p*, its control terminal is connected to the line for the signal S41, its input terminal is connected to the output of the switching speed detecting circuit 21*p* for P-channel, and its output terminal is connected to the input of the OR circuit 22. In the latch circuit 72n, its control terminal is connected to the line for the signal S41, its input terminal is connected to the output of the switching speed detecting circuit 21n for N-channel, and its output terminal is connected to the input of the AND circuit 23.

Figure 14:
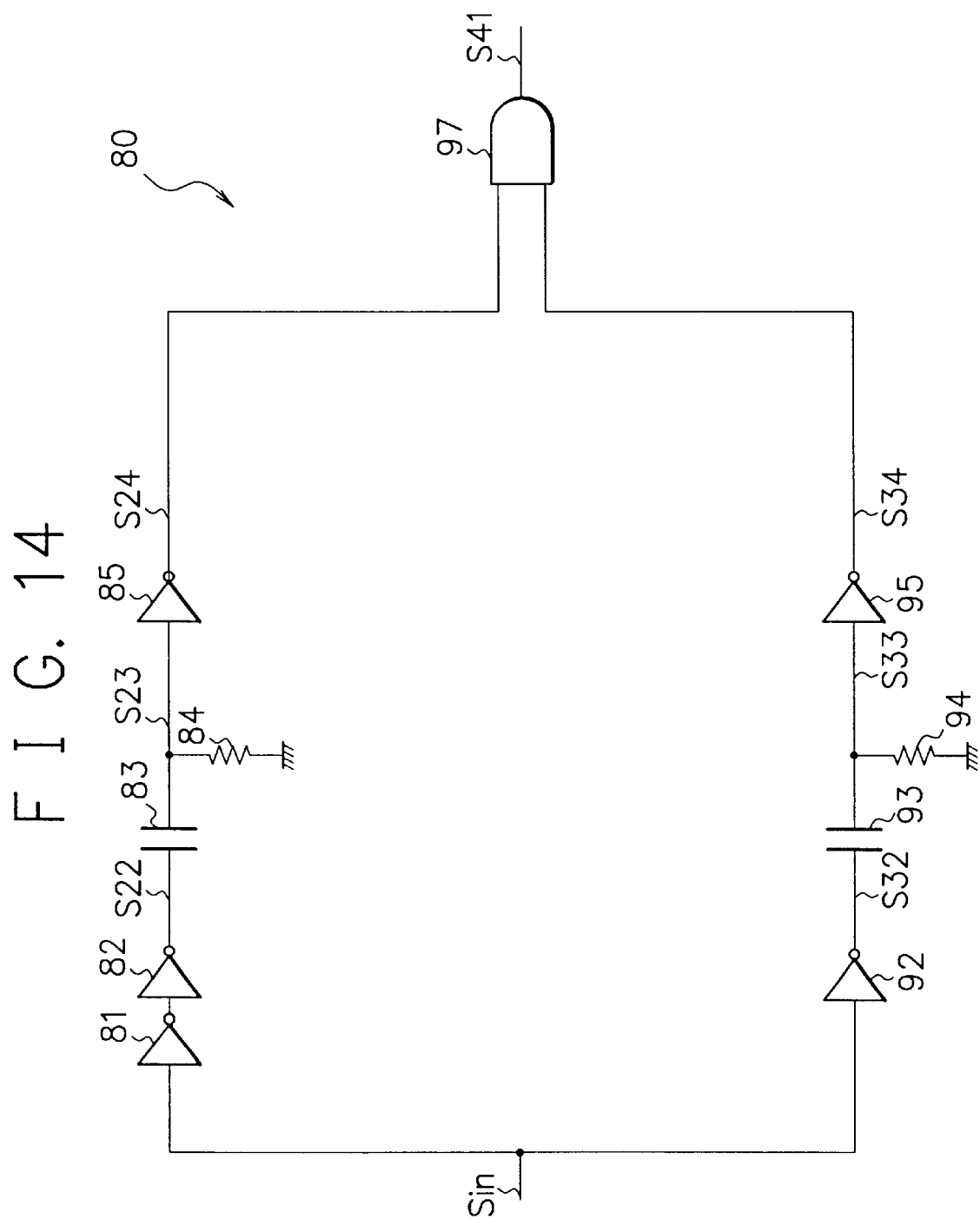
FIG. 14 is a circuit diagram showing the construction of a transient detecting circuit.

FIG. 14 shows an example of construction of the transient detecting circuit 80. An inverter 81 inputs the input signal Sin. The inverter 81, an inverter 82, a condenser 83, and an inverter 85 are connected in series. A resistance 84 is connected between the interconnection node between the condenser 83 and the inverter 85, and the ground potential.

An inverter 92 inputs the input signal Sin. The inverter 92, a condenser 93, and an inverter 95 are connected in series. A resistance 94 is connected between the interconnection node between the condenser 93 and the inverter 95, and the ground potential.

In an AND circuit 97, its one input is connected to the output of the inverter 85, and its other input is connected to the output of the inverter 95.

Figure 15:
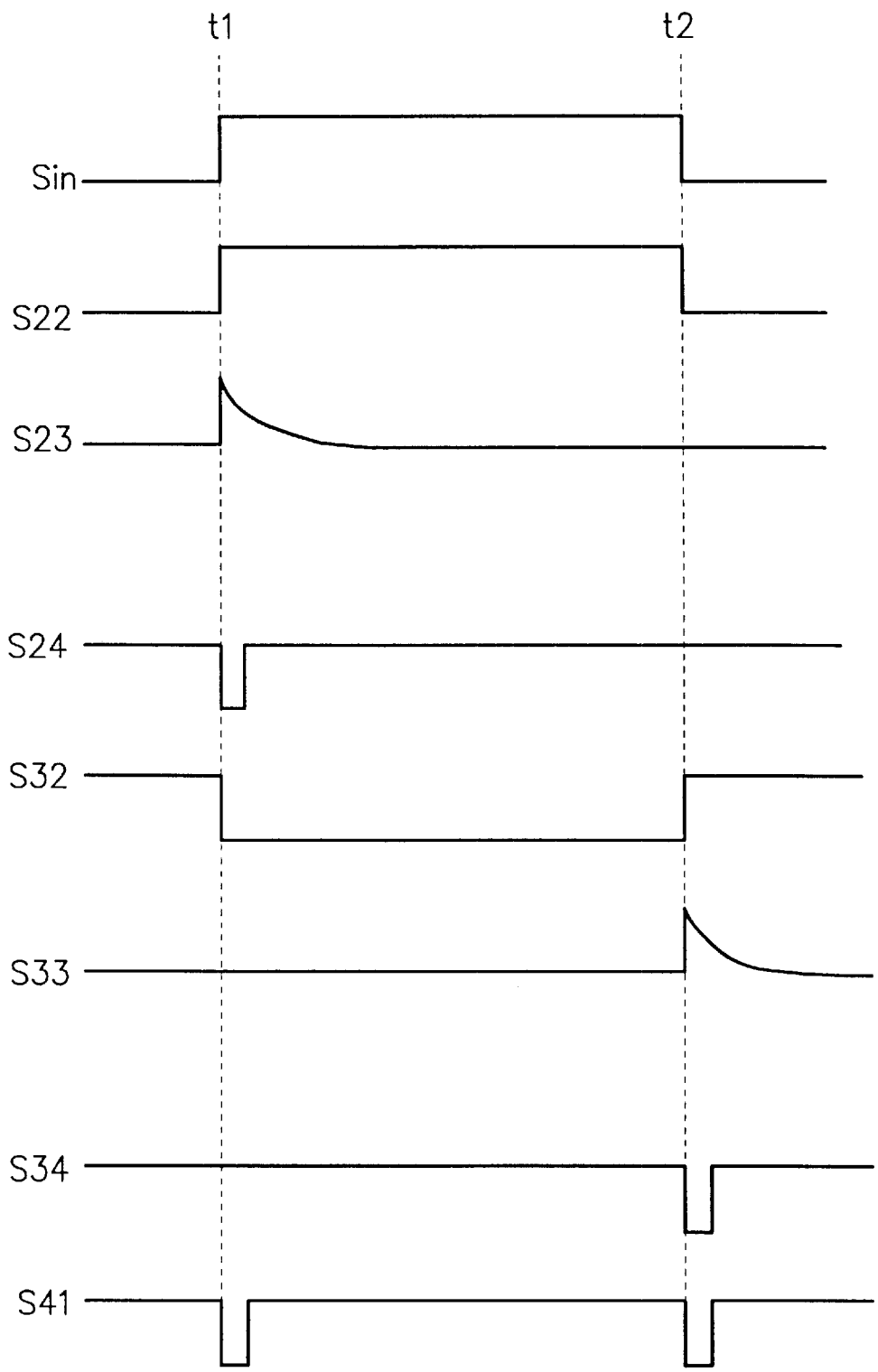
FIG. 15 is a timing chart of the transient detecting circuit.

The operation of the transient detecting circuit 80 will be described with reference to the timing chart of FIG. 15. A case wherein the input signal Sin rises at a time t1 and falls at a time t2 will be described by way of example. The output signal S22 of the inverter 82 is the same as the input signal Sin. The input signal S23 of the inverter 85, which corresponds to a differentiated signal of the signal S22, rises at the time t1 and then attenuates gradually. The output signal S24 of the inverter 85 is the inverted signal of the input signal S23 on a binary logic level.

The output signal S32 of the inverter 92 is a logically inverted signal of the input signal Sin. The input signal S33 of the inverter 95, which corresponds to a differentiated signal of the signal S32, rises at the time t2 and then attenuates gradually. The output signal S34 of the inverter 95 is the inverted signal of the signal S33 on a binary logic level. The output signal S41 of the AND circuit 97 is the AND signal of the signals S24 and S34. The signal S41 is at a low level while the input signal Sin is changing, and at a high level when it is not changing.

Figure 12:
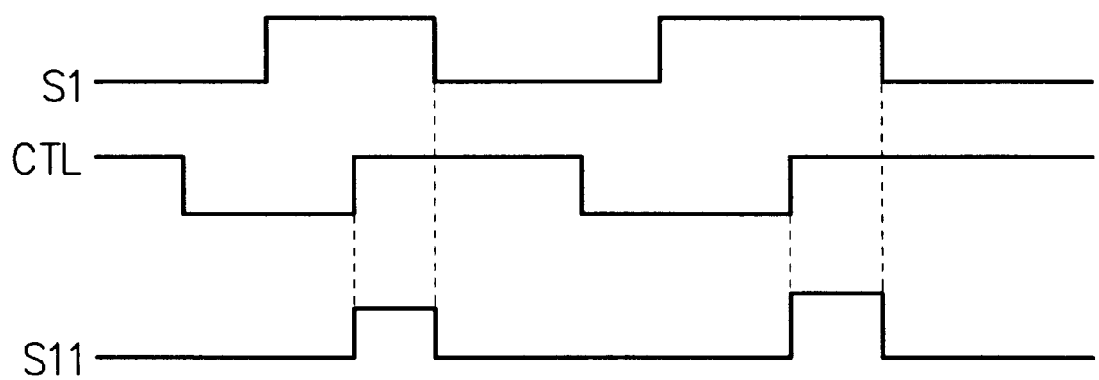
FIG. 12 is a timing chart of a latch circuit.

In FIG. 13, the buffer transistor size is changeable only when the input signal Sin is not changing since the latch circuits 72n and 72p operate as shown in FIG. 12. When the input signal Sin is changing, since the buffer transistor size does not change, the stable output signal Sout can be output.

As described above, in the first to seventh embodiments, the switching speed of the buffer transistors can be controlled into a proper value even when there is a change in process conditions. In the first and second embodiments, since the switching speed is detected and controlled in real time, the switching speed of the buffer transistors can be controlled into a proper value even when there is a change in process conditions, the power supply voltage and/or temperature. Controlling the switching speed into a proper value can prevent a malfunction and noise.

In the third and fourth embodiments, since data of the switching speed is stored in the memory to control the switching speed of the buffer transistors, the size and cost of the semiconductor device can be reduced. In the fifth embodiment, the switching speed of the buffer transistors can be controlled also in the input/output buffer.

In the sixth embodiment, since the buffer transistor size is not changed in the output state, and can be changed only in the input state, a stable output signal can be obtained. In the seventh embodiment, since the buffer transistor size is not changed while the input signal is changing, and it can be changed only when the input signal is not changing, a stable output signal can be obtained.

Figure 16:
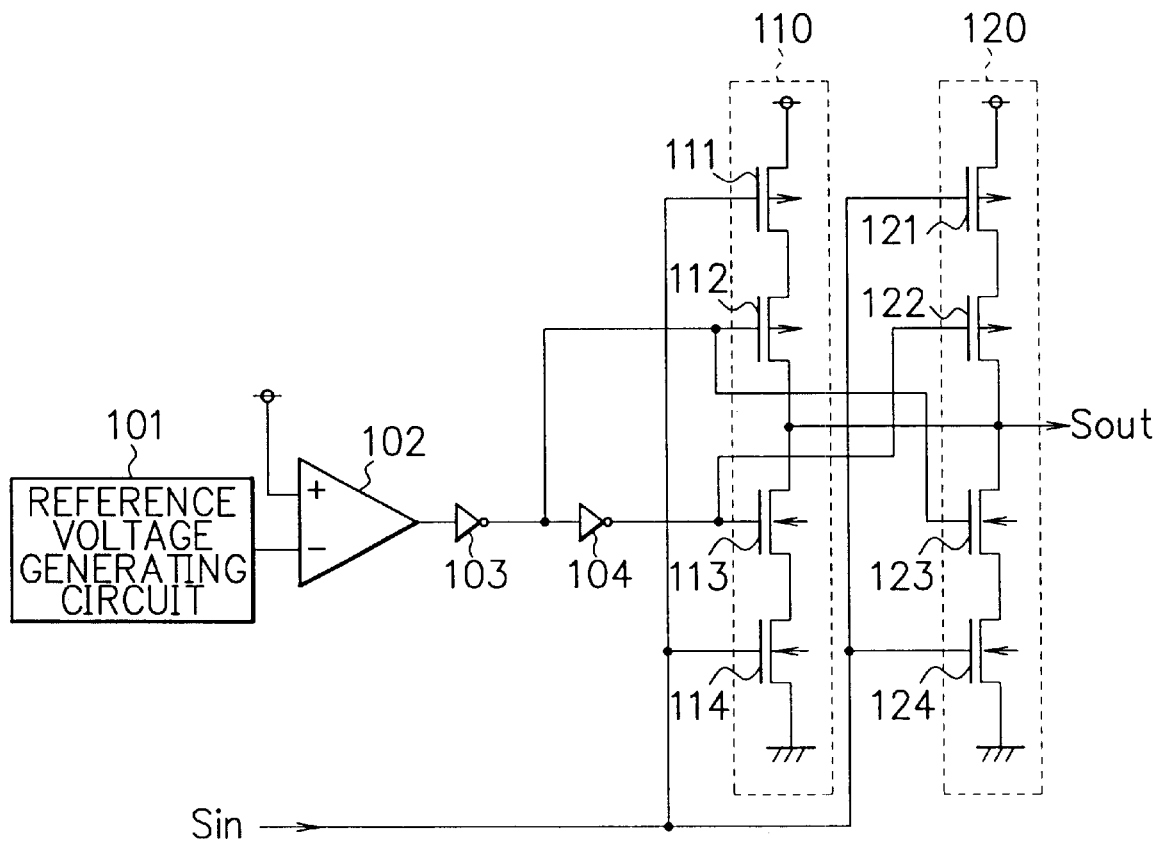
FIG. 16 is a circuit diagram showing the construction of output buffers according to a prior art.

In the above embodiments, the buffer transistor size is changed by changing the number of buffer transistors connected in parallel. However, as shown in FIG. 16, buffers 110 and 120 different in transistor size may be provided. In this case, by selecting one of the buffers 110 and 120, the transistor size is changed to control the switching speed. Bipolar transistors may also be used instead of MOS transistors.

Any of the above-described embodiments is only for the purpose of example and they are never used to limit the technical scope of the present invention. Therefore, the present invention can be embodied in various forms without departing from its technical spirit or its principal feature.

As described above, according to the embodiments, the switching speed of a buffer transistor or a detection transistor, which speed may change in accordance with process conditions and/or temperature, is detected in advance or in real time, and the buffer transistor size is changed in accordance with the detected switching speed. Even when there is a change in process conditions and/or temperature, by changing the buffer transistor size accordingly, the switching speed of the buffer transistor can be controlled into a proper value. Controlling the switching speed into a proper value can prevent a malfunction and noise.

What is claimed is:

1. A semiconductor device, comprising:
   at least one of an output buffer and an input/output buffer, including a buffer transistor; and
   a control circuit for changing a size of said buffer transistor on the basis of the switching speed of at least one of said buffer transistor and a detection transistor,
   wherein said control circuit includes said detection transistor, detects the switching speed of said detection transistor, and changes said size of said buffer transistor on the basis of said switching speed detected, and
   wherein said control circuit can change said size of said buffer transistor only when said input/output buffer is in an input state.

2. The device according to claim 1, wherein said control circuit includes a latch circuit, and said latch circuit can change said size of said buffer transistor only when said input/output buffer is in said input state.

3. The device according to claim 1, wherein said control circuit includes a comparator for comparing a voltage generated in said detection transistor with a reference voltage, and changes said size of said buffer transistor in accordance with the comparison result by said comparator.

4. The device according to claim 1, wherein said control circuit makes a memory store data of the switching speed of at least one of said buffer transistor and said detection transistor measured in advance, and changes said size of said buffer transistor in accordance with said data of said switching speed stored in said memory.

5. The device according to claim 1, wherein said memory is a nonvolatile memory.

6. The device according to claim 1, wherein said memory is a fuse system.

7. The device according to claim 1, wherein said control circuit changes said size of said buffer transistor by controlling the number of buffer transistors connected in parallel.

8. The device according to claim 1, wherein said buffer transistor is a CMOS transistor.

9. The device according to claim 1, wherein said control circuit changes said size of said buffer transistor in accordance with the switching speed of a P-channel MOS transistor and the switching speed of an N-channel MOS transistor.

10. The device according to claim 1, wherein said buffer transistor is a bipolar transistor.

11. A semiconductor device comprising:
   at least one of an output buffer and an input/output buffer, including a buffer transistor; and
   a control circuit for changing a size of said buffer transistor on the basis of the switching speed of at least one of said buffer transistor and a detection transistor,
   wherein said control circuit includes said detection transistor, detects the switching speed of said detection transistor, and changes said size of said buffer transistor on the basis of said switching speed detected, and
   wherein said control circuit can change said size of said buffer transistor only when an output of at least one of said output buffer and said input/output buffer is not changing.

12. The device according to claim 11, wherein said control circuit includes a latch circuit, and said latch circuit can change said size of said buffer transistor only when said output is not changing.

13. The device according to claim 11, wherein said control circuit includes a comparator for comparing a voltage generated in said detection transistor with a reference voltage, and changes said size of said buffer transistor in accordance with the comparison result by said comparator.

14. The device according to claim 11, wherein said control circuit makes a memory store data of the switching speed of at least one of said buffer transistor and said detection transistor measured in advance, and changes said size of said buffer transistor in accordance with said data of said switching speed stored in said memory.

15. The device according to claim 11, wherein said memory is a nonvolatile memory.

16. The device according to claim 11, wherein said memory is a fuse system.

17. The device according to claim 11, wherein said control circuit changes said size of said buffer transistor by controlling the number of buffer transistors connected in parallel.

18. The device according to claim 11, wherein said buffer transistor is a CMOS transistor.

19. The device according to claim 11, wherein said control circuit changes said size of said buffer transistor in accordance with the switching speed of a P-channel MOS transistor and the switching speed of an N-channel MOS transistor.

20. The device according to claim 11, wherein said buffer transistor is a bipolar transistor.

21. A control method for at least one of an output buffer and an input/output buffer, including a buffer transistor, said method comprising the step of:
   (a) changing a size of said buffer transistor on the basis of a switching speed of at least one of said buffer transistor or a detection transistor;
   (b) detecting the switching speed of the detection transistor; and
   (c) changing the size of the buffer transistor only when the input/output buffer is in an input state.

22. A control method for at least one of an output buffer and an input/output buffer, including a buffer transistor, said method comprising the step of:
   (a) changing a size of said buffer transistor on the basis of a switching speed of at least one of said buffer transistor or a detection transistor;
   (b) detecting the switching speed of the detection transistor; and
   (c) changing said size of said buffer transistor only when an output of at least one of said output buffer and said input/output buffer is not changing.

* * * * *